United States Patent
Xiao et al.

(10) Patent No.: US 9,634,151 B1
(45) Date of Patent: Apr. 25, 2017

(54) HIGH VOLTAGE JUNCTIONLESS FIELD EFFECT DEVICE AND ITS METHOD OF FABRICATION

(71) Applicant: Zing Semiconductor Corporation, Shanghai (CN)

(72) Inventors: Deyuan Xiao, Shanghai (CN); Richard R. Chang, Shanghai (CN)

(73) Assignee: ZING SEMICONDUCTOR CORPORATION, Shanghai (CN)

( * ) Notice: Subject to any disclaimer, the term of this patent is extended or adjusted under 35 U.S.C. 154(b) by 0 days.

(21) Appl. No.: 15/012,873

(22) Filed: Feb. 2, 2016

(30) Foreign Application Priority Data

Nov. 6, 2015 (CN) .......................... 2015 1 0746889

(51) Int. Cl.
H01L 29/78 (2006.01)
H01L 27/092 (2006.01)
H01L 27/108 (2006.01)
H01L 27/12 (2006.01)
H01L 29/788 (2006.01)
H01L 29/66 (2006.01)
H01L 29/24 (2006.01)
H01L 21/02 (2006.01)
H01L 29/51 (2006.01)
H01L 21/443 (2006.01)
H01L 29/49 (2006.01)
H01L 21/4763 (2006.01)
H01L 21/027 (2006.01)
(Continued)

(52) U.S. Cl.
CPC ...... *H01L 29/7886* (2013.01); *H01L 21/0217* (2013.01); *H01L 21/0228* (2013.01); *H01L 21/0262* (2013.01); *H01L 21/0273* (2013.01); *H01L 21/02266* (2013.01); *H01L 21/02271* (2013.01); *H01L 21/02568* (2013.01); *H01L 21/02631* (2013.01); *H01L 21/443* (2013.01); *H01L 21/47635* (2013.01); *H01L 27/0886* (2013.01); *H01L 27/0924* (2013.01); *H01L 27/10879* (2013.01); *H01L 27/1211* (2013.01); *H01L 29/0649* (2013.01); *H01L 29/24* (2013.01); *H01L 29/495* (2013.01); *H01L 29/51* (2013.01); *H01L 29/517* (2013.01); *H01L 29/66969* (2013.01); *H01L 29/785* (2013.01)

(58) Field of Classification Search
CPC ............. H01L 27/0886; H01L 27/0924; H01L 27/10826; H01L 27/1211; H01L 29/785
See application file for complete search history.

(56) References Cited

U.S. PATENT DOCUMENTS

2016/0365347 A1\* 12/2016 Bao ..................... H01L 27/0924

\* cited by examiner

*Primary Examiner* — Thanhha Pham
(74) *Attorney, Agent, or Firm* — Kilpatrick Townsend & Stockton LLP

(57) ABSTRACT

A structure and a method of fabrication are disclosed of a high voltage junctionless field effect device. A channel layer and a barrier layer are formed sequentially underneath the gate structure. The width of energy band gap of the barrier layer is wider than that of the channel layer. Thus the two dimensional electron gas (2-DEG) generated in the interface between the channel layer and the barrier layer of this junctionless field effect device has higher electron mobility. The structure of the device of this disclosure has a higher breakdown voltage which is advantageous for a high voltage junctionless field device. The structure offers advantages in device performance and reliability.

15 Claims, 10 Drawing Sheets

(51) Int. Cl.
*H01L 29/06* (2006.01)
*H01L 27/088* (2006.01)

HIGH VOLTAGE JUNCTIONLESS FIELD EFFECT DEVICE AND ITS METHOD OF FABRICATION

The present application claims the priority to Chinese Patent Applications No. 201510746889.2, filed with the Chinese State Intellectual Property Office on Nov. 6, 2015, which is incorporated herein by reference in its entirety.

TECHNICAL FIELD

The present invention relates to the field of high voltage modulation-doped high electron mobility field effect device. In particular, the invention relates to a structure and method of fabrication of a high voltage junctionless field effect device for providing enhancement in performance and reliability.

BACKGROUND

The basic structure of a high electron mobility transistor, HEMT, has a source and drain structure with a heterojunction formed by modulation-doped channel layer and donor-supply layer, typically consisting of an undoped GaAs channel layer and a highly doped n-type AlGaAs donor-supply layer. Using a single doped AlGaAs and undoped GaAs heterojunction to achieve field effect control of electron accumulation at the interface. The electrons, two dimensional electron gas, 2-DEG, generated in the thin junction layer, confined by quantum effects to a thin sheet, are free to move along this thin layer without hindrance and interference of doped ionized impurities, resulting high electron mobility allowing fast response times and low noise operation. HEMT is commonly used in voltage control and regulation devices, by varying the gate voltage, Vg, to change the depth of hetero-junction potential well, to vary the sheet charge density of 2-DEG achieving the regulation of the working current.

For GaAs based HEMT, normally the heavily doped n-AlxGa1-xAs control layer is depleted. For depletion mode device, the n-AlxGa1-xAs is thicker and heavily doped, 2-DEG exist even at Vg=0. Otherwise when the device is enhancement-mode, at Vg=0, Schottky depletion layer extended to GaAs layer; Hence, for HEMT, the main influencing factor is the doping density and the especially the thickness of wide band gap semiconductor layer. The surface density of 2-DEG, Ns, in HEMT, is mainly influenced by the sub-band of potential well of the heterojunction (i=0 and 1). 2-DEG surface charge density is Vg regulated.

SUMMARY

The purpose of the present invention is to provide a method of forming a high-voltage junctionless field effect device of high electron mobility and high performance. The invention is a non-planar quantum well transistor with 2D electronic layer channel, comprising a source electrode, a drain electrode and a 2D semiconducting channel layer consisting of a single or multi-layered 2-dimensional material and a 2D semiconducting barrier layer; The energy band-gap width of the 2D semiconducting barrier Layer is larger than that of the 2D semiconducting channel layer. The 2D semiconducting material consisting of a single or multi 2-dimensional layer(s) made from one of the following materials: $MoS_2$, $WS_2$, $MoS_2$, $MoSe_2$, $WS_2$, $WSe_2$, $MoTe_2$ or $WTe_2$.

The present invention provides a method of fabrication of a high-voltage junctionless field effect device, comprising the steps of:

Providing a substrate;

Fin-shaped structure formed on the substrate;

Sequentially formed on the surface of the fin-shaped structure a channel layer, a barrier layer, a gate dielectric layer and the metal layer, wherein the energy band gap of the barrier layer is greater than the width of the energy band gap of the channel layer;

Etching the metal layer and the gate dielectric layer to form a gate structure;

Forming spacers on both sides of the gate structure;

Formed source and drain electrodes on the side walls on both sides of the barrier layer.

Further, in described method of forming the high-voltage junctionless field effect device, the substrate is silicon on insulator.

Further, in the high-voltage junctionless field effect device, the channel layer is made of $MoS_2$, $WS_2$, $MoSe_2$, $WSe_2$, $WTe_2$ the $MoTe_2$ or one.

Further, in the high-voltage junctionless field effect device, a thickness range of the channel layer is 0.5 nm~10 nm.

Further, in the high-voltage junctionless field effect device, the barrier layer is made of $MoS_2$, $WS_2$, $MoSe_2$, $WSe_2$, $WTe_2$ or one of the $MoTe_2$.

Further, in the high-voltage junctionless field effect device, a thickness of the barrier layer is a range of 0.1 nm~5 nm.

Further, in the high-voltage junctionless field effect device, the channel layer and the barrier layer are made by using the processes of CVD, PVD, ALD, ALE, MBE, MOCVD, UHCVD, RTCVD or MEE.

Further, in the forming method of the described high-pressure junctionless field effect device, the gate dielectric layer is made of silica, alumina, zirconia or hafnia.

Further, in the described high-pressure junctionless field effect device, the gate dielectric layer are formed using MOCVD, CVD, ALD or MBE process.

Further, in the high-voltage junctionless field effect device, the metal layer is made of Cr or Au.

Further, in the high-voltage junctionless field effect device, the metal layer thickness in the range of 100 nm~300 nm.

Further, in the high-voltage junctionless field effect device, the metal layer is formed using PVD, MOCVD or ALD process.

Further, in the high-voltage junctionless field effect device, the steps of etching the metal layer and the gate dielectric layer comprises:

Photoresist coating on the metal layer, and the patterning the photoresist;

The patterned photoresist serves as a mask, in the process of sequentially dry etching the metal layer and the gate dielectric layer, to form a gate structure.

Further, in the high-voltage junctionless field effect device, the sidewall spacers are made of silicon nitride.

Further, in the high-voltage junctionless field effect device, the source and drain electrodes are made of Au.

In the present invention, a high-pressure junctionless field effect device is proposed, using the above mentioned method of forming a high-voltage junctionless field effect device, characterized by:

comprising a substrate provided with a fin-shaped structure, a channel layer, a barrier layer, a gate dielectric layer, a metal layer, spacers and the source and drain electrodes, wherein the said channel layer, the barrier layer and the gate dielectric layer are sequentially formed on the fin-shaped structure, the metal layer located on the surface of the gate dielectric layer, the sidewall spacer structure located on both sides of the gate, the source and drain electrodes located on both sides of the barrier layer sidewall.

Compared with the prior art, the beneficial effects of the present invention is mainly in: successively under the gate structure forming a channel layer and the barrier layer and the barrier layer bandgap energy is wider than the band gap width of the channel layer. This structure allows the generation the two-dimensional electron gas on the interface between the channel layer and the barrier layer of the high-voltage junctionless field effect device, having high electron mobility, and high breakdown voltage, resulting in better performance and reliability.

BRIEF DESCRIPTION OF THE DRAWINGS

FIGS. 2A to 9A schematically illustrate the cross-sections parallel to the channel direction of a high voltage junctionless field effect device according to an embodiment of present invention.

FIGS. 2B to 9B schematically illustrate the cross-sections perpendicular to the channel direction of a high voltage junctionless field effect device according to an embodiment of present invention.

DETAILED DESCRIPTION

A schematic and more detailed description of a method of fabrication of a high voltage junctionless field effect device, a preferred embodiment of the present invention, is provided. The embodiment is described in sufficient detail to enable those skilled in the art to practice it. It should be understood that the invention described herein may be modified and varied, and still achieve advantageous effects of the present invention. Thus, the fabrication processes described should be understood as widely known to those skilled in the art, but not as a limitation of the present invention.

In the following description, not all the features of well-known functions and structures of an actual embodiment are described in detail, as they may entail unnecessary details. It should be understood that in the development of any actual embodiment, the implementation details must be made in order to achieve the specific goals of the developers, such as in accordance with the system or the commercial constraint. In addition, it should be understood that such a development effort might be complex and time-consuming, but for those skilled in the art they are the processes are widely known and standard routine practices.

In the following paragraphs with reference to the accompanying drawings by way of example the present invention is described more specifically. According to the following description and claims, advantages and features of the present invention will become apparent. It should be noted that the drawings are used in a very simplified form and are not to scale, only to facilitate and assist the description of an embodiment of the present invention.

Figure 1:
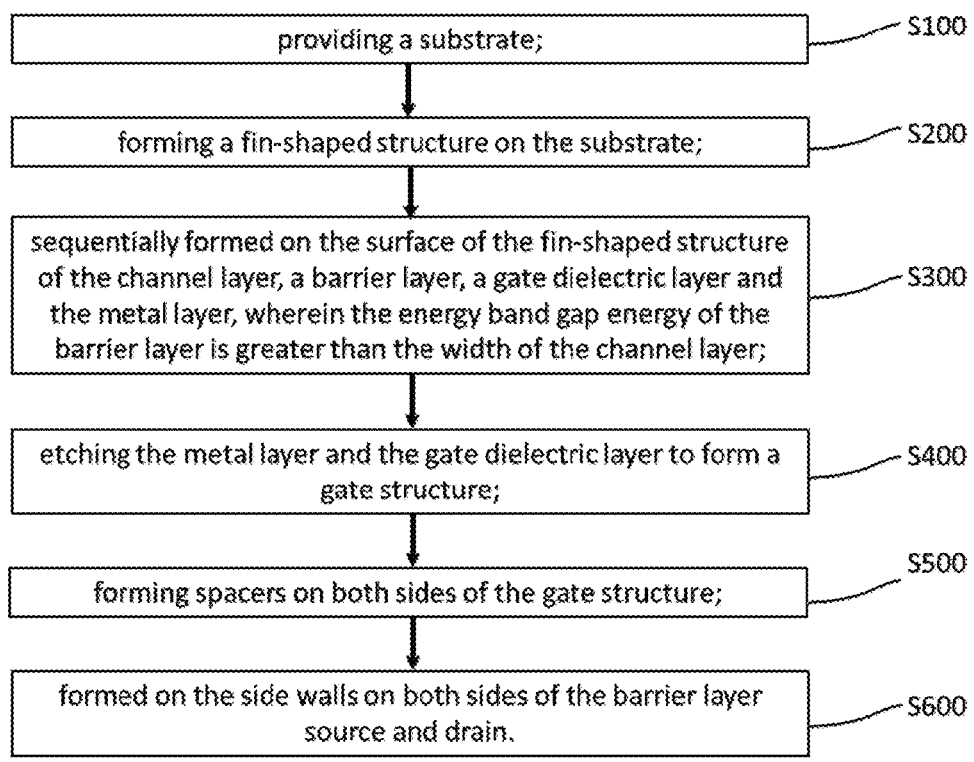
FIG. 1 illustrates the flow chart of forming a high voltage junctionless field effect device according to an embodiment of present invention.

FIG. 1 is a schematic of the processes of forming the proposed invention of a high-voltage junctionless field effect device, comprising the steps of:

S100: providing a substrate;
S200: forming a fin-shaped structure on the substrate;
S300: sequentially formed on the surface of the fin-shaped structure of the channel layer, a barrier layer, a gate dielectric layer and the metal layer, wherein the energy band gap energy of the barrier layer is greater than the width of the channel layer;
S400: etching the metal layer and the gate dielectric layer to form a gate structure;
S500: forming spacers on both sides of the gate structure;
S600: formed on the side walls on both sides of the barrier layer source and drain.

Figure 2A:
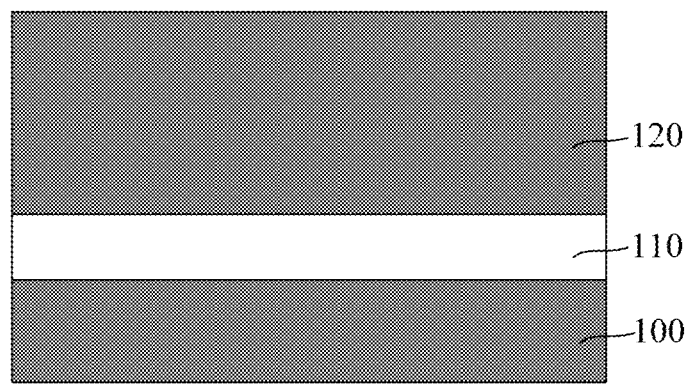
Figure 2B:
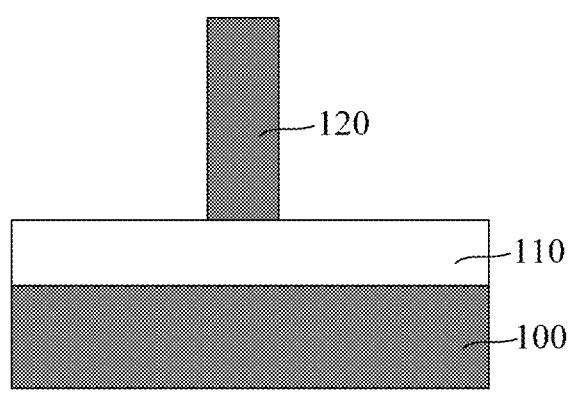
Figure 3A:
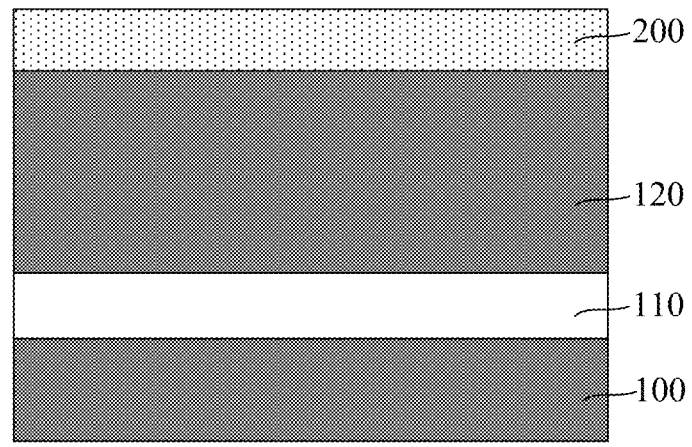
Figure 3B:
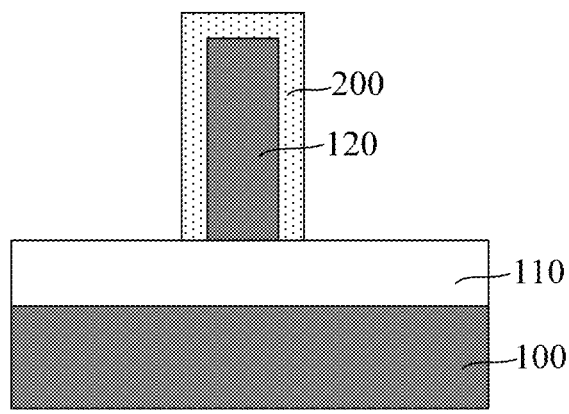
Figure 4A:
Figure 4B:
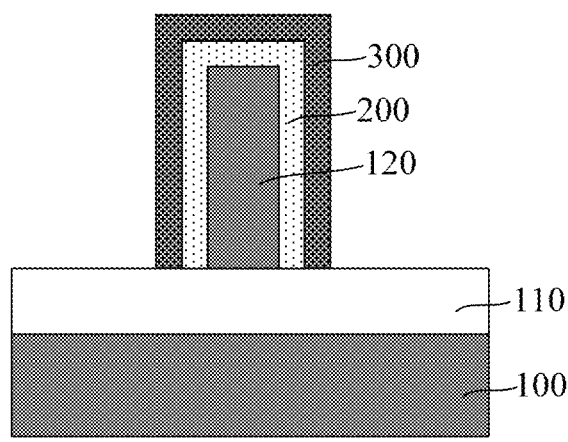

Silica insulating layer specific, refer to FIGS. 2A and 2B, the substrate in the present embodiment, a silicon-on-insulator made of a substrate, comprising a silicon substrate 100, is formed on the silicon substrate 100, and 110 the silicon layer is formed on the insulating layer 110 of silicon dioxide 120, and then, using the resist coating, exposure, development and other processes, the surface of the silicon layer 120 is a photoresist layer to the patterned photoresist, an abrasive layer on the silicon layer 120 is etched to form a fin-shaped structure, shown in FIG. 2B.

Next, refer to FIGS. 3A, 3B, 4A and 4B, the structure of the surface of the fin channel layer 200 is formed sequentially, the barrier layer 300, wherein the energy gap of the barrier layer 300 is larger than the channel layer 200 bandgap; In the present embodiment, the channel layer 200 made of $MoS_2$, $WS_2$, $MoSe_2$, $WSe_2$, $MoTe_2$, or one kind of $WTe_2$, for example, $WS_2$, with thickness in the range of 0.5 nm~10 nm, e.g. 5 nm; the barrier layer 300 is made of $MoS_2$, $WS_2$, $MoSe_2$, $WSe_2$, $WTe_2$.

Next, refer to FIGS. 3A, 3B, 4A and 4B, the structure of the surface of the fin channel layer 200 is formed sequentially, the barrier layer 300, wherein the energy gap of the barrier layer 300 is larger than the channel layer 200 bandgap; In the present embodiment, the channel layer 200 made of $MoS_2$, $WS_2$, $MoSe_2$, $WSe_2$, $MoTe_2$, or one kind of $WTe_2$, for example, $WS_2$, with thickness in the range of 0.5 nm~10 nm, e.g. 5 nm; the barrier layer 300 is made of $MoS_2$, $WS_2$, $MoSe_2$, $WSe_2$, the $MoTe_2$ or one kind of $WTe_2$, having a thickness in the range of 0.1 nm~5 nm, for example, 3 nm; for the need to ensure energy band gap of the barrier layer 300 is greater than the bandgap of the channel layer 200, and therefore, preferably, the material of the barrier layer 300 is different than the material of the channel layer 200, wherein, the channel layer 200 and the barrier layer 300 can employ CVD (Chemical Vapor Deposition, Chemical Vapor Deposition), PVD (Physical Vapor Deposition, Physical Vapor Deposition), ALD (Atomic Layer Deposition, atomic deposition method), ALE (Atomic Layer Epitaxy, atomic epitaxy), MBE (Molecular Beam Epitaxy, molecular beam epitaxy), MOCVD (Metal-Organic Chemical Vapor Deposition epitaxy, metal organic chemical vapor deposition epitaxy), UHCVD (Ultra-High vacuum CVD epitaxy, ultra-high vacuum vapor deposition), RTCVD (Reduced-Temperature CVD epitaxy, reduce temperature vapor deposition) or MEE (Migration Enhanced Epitaxy, migration enhanced epitaxy) process to form.

Figure 5A:
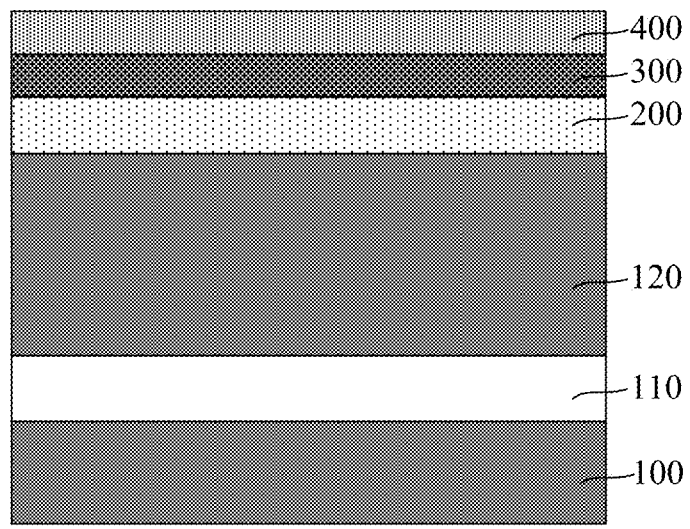
Figure 5B:
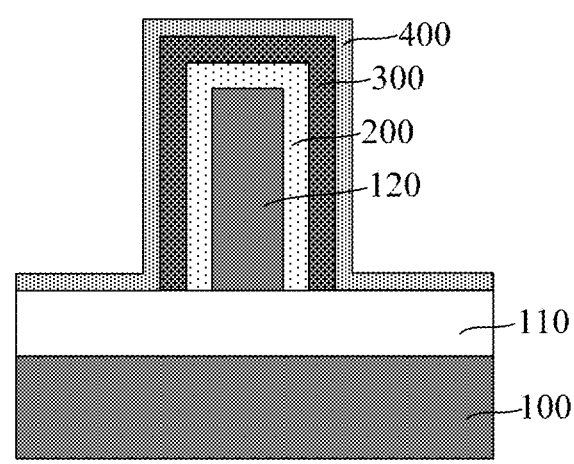

Next, refer to FIGS. 5A and 5B, on the surface of the barrier layer 300 and silicon dioxide 110 silica, a gate dielectric layer 400 is formed. The gate dielectric layer 400 is made of alumina, zirconia or hafnia forming.

Figure 6A:
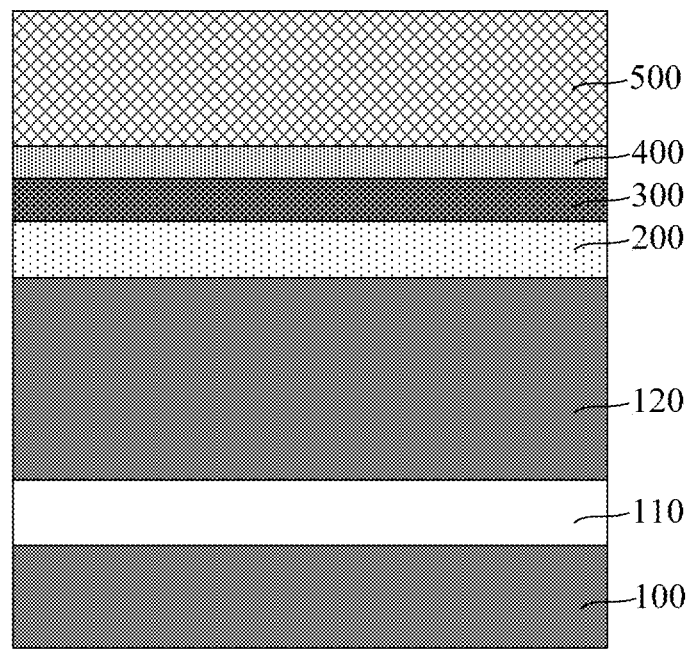
Figure 6B:
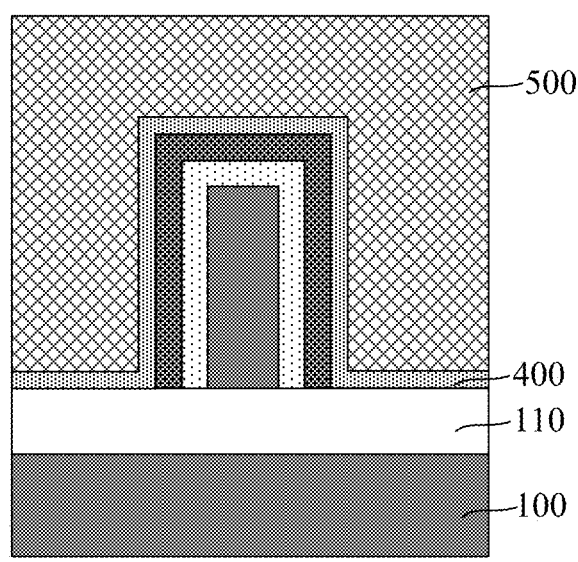

Refer to FIGS. 6A and 6B, on the surface of the gate dielectric layer 400, a metal layer 500, the metal layer 500 made of Cr or Au is formed.

Figure 7A:
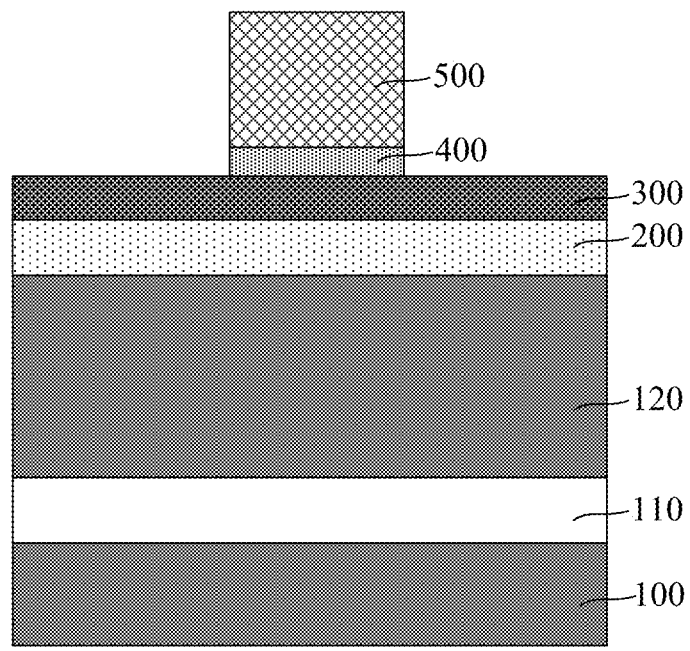
Figure 7B:
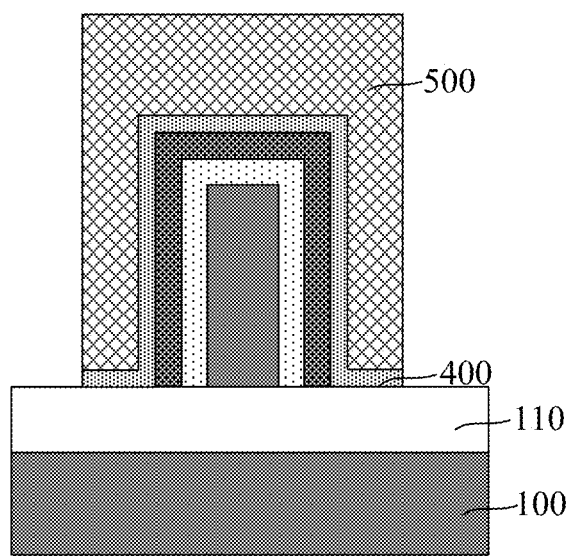

Next, refer to FIG. 7A and FIG. 7B, sequentially etching the metal layer 500 and the gate dielectric layer 400, forming a gate structure, which includes forming a gate metal layer 400 and a surface of the gate dielectric layer 500, wherein, of the gate dielectric layer 400 portions of silicon dioxide layer 110 and the barrier 300 are exposed.

Figure 8A:
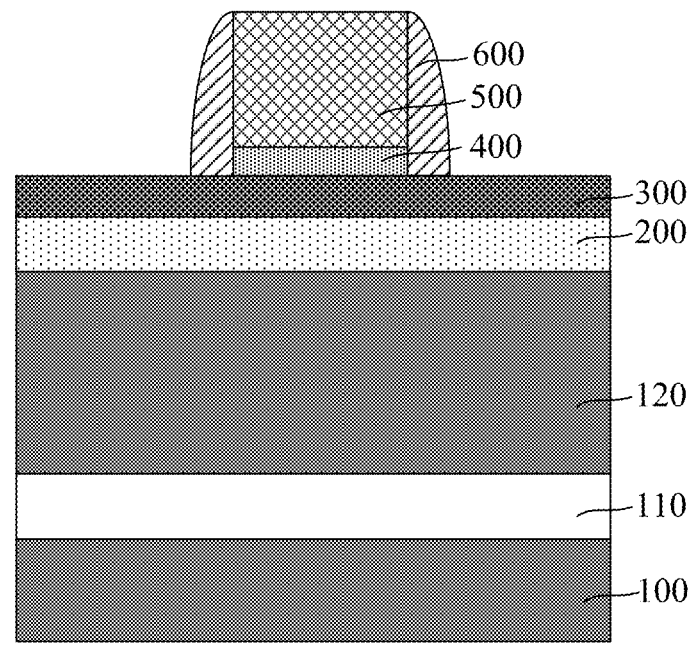
Figure 8B:
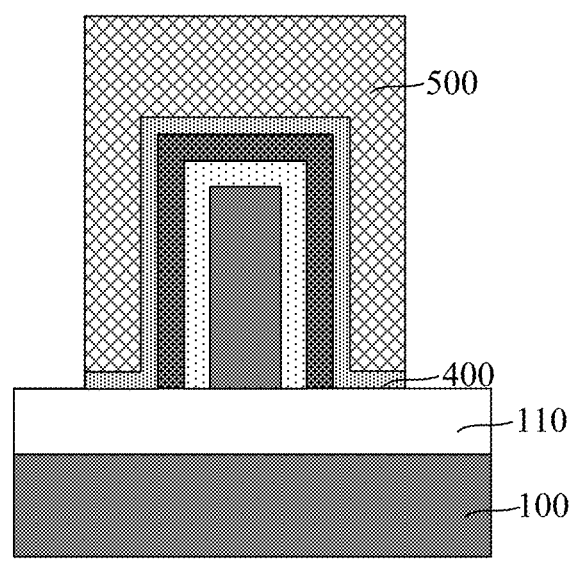

Next, refer to FIG. 8A and FIG. 8B, the spacers 600 are formed on both sides of the gate structure, the sidewall spacer 600 is made of silicon nitride.

Figure 9A:
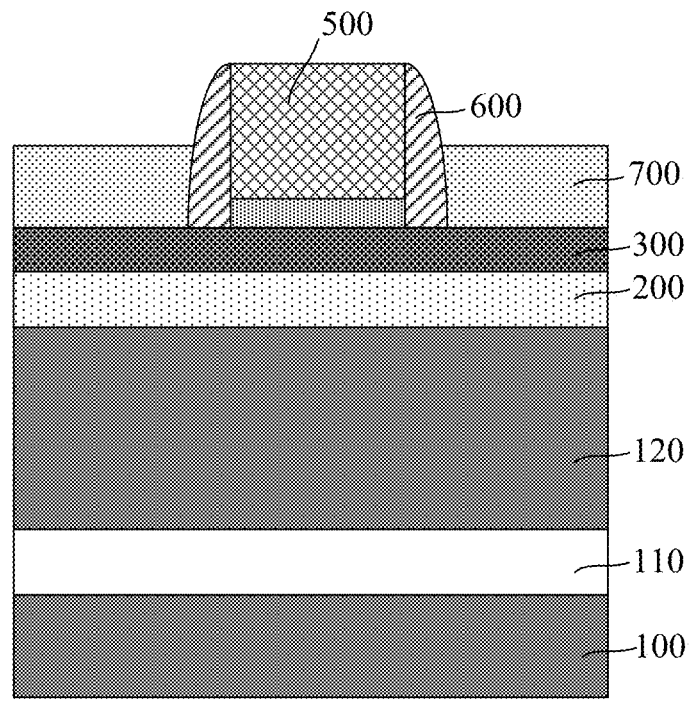
Figure 9B:
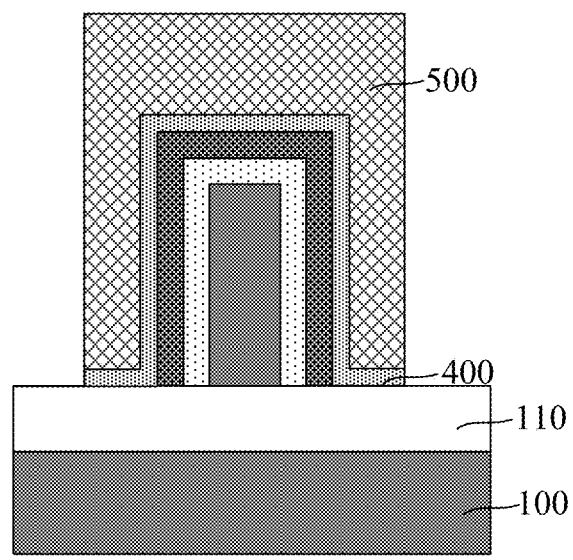

Next, refer to FIGS. 9A and 9B, on both sides of the sidewall spacer 600, on the surface of the barrier layer 300, source and drain 700 are formed, thus, a high-voltage junctionless field effect device is formed.

Another embodiment of this invention is proposed. A high-voltage junctionless field effect device, formed using the method as described above comprising: a substrate provided with a fin-shaped structure, the channel layer 200, barrier layer 300, gate dielectric layer 400, the metal layer 500, spacers 600, and source and drain electrodes 700, wherein the channel layer 200, barrier layer 300 and the gate dielectric layer 400 are sequentially formed on the fin-shaped structure. The metal layer 500 is located on the surface of the gate dielectric layer 400, the sidewall spacer structure 600 located on both sides of the gate, the source and drain electrodes 700 located on the surface of the barrier layer 300 situated on both side of the sidewall spacer 600.

Figure 10A:
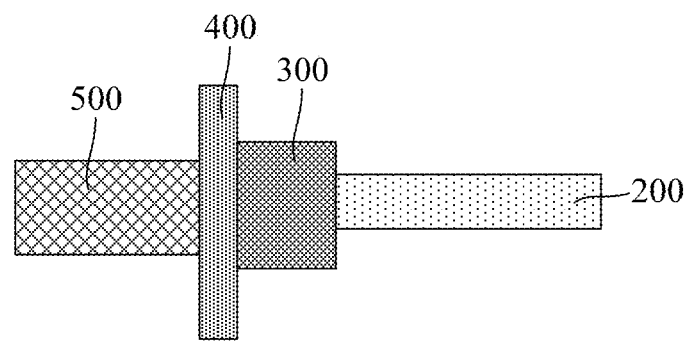
FIGS. 10A and 10B schematically illustrate the generation of two dimensional electron gas in a high voltage junctionless field effect device according to an embodiment of present invention.
Figure 10B:
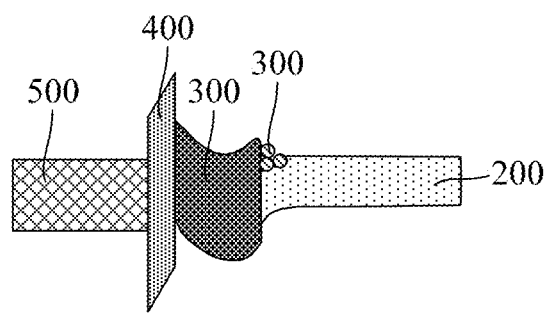

Since, in the present embodiment, the barrier layer 300 and the channel layer 200 formed have different energy band, thereby two-dimensional electron gas is generated at the interface of the barrier layer 300 and the channel layer 200. Specifically, refer to FIGS. 10A and 10B, in FIG. 10A, when the gate voltage is not applied to gate electrode 510, the energy bands of gate dielectric layer 400, barrier layer 300 and the channel layer 200 have not changed, there is no two-dimensional electron gas produced as shown in FIG. 10B, when a voltage is applied to the gate electrode 510, the energy band of the gate dielectric layer 400, a barrier layer 300 and the channel layer are changed, two-dimensional electron gas (2-DEG) 210 is produced at the interface of the barrier layer 300 and the channel layer 200, thereby increasing the carrier mobility, greatly enhance the performance of the device.

In summary, the present invention provides an embodiment of a high voltage junctionless field effect device and method of forming it. The gate structure is sequentially formed beneath the channel layer and the barrier layer. The energy band gap width of the barrier layer is greater than that of the channel layer, this made possible the generation of two-dimensional electron gas at interface between the channel layer and the barrier layer. The formed high-voltage junctionless field effect device of this invention has high electron mobility, and also has a high breakdown voltage, and thus results a better performance and reliability.

While the present invention has been described in an illustrative manner, it should be understood that the terminology used is intended to be in a nature of words of description rather than of limitation. Many modifications and variations of the present invention and other versions are possible in light of the above teachings, and could be apparent for those skilled in the art. The above described embodiments of the present invention do not limit the present invention in any way. Any person skilled in the art, without departing from the technical scope of the present invention, can modify and vary technical solutions and technical content of the disclosed present invention. The modifications and variations still fall within the scope of the present invention.

What is claimed is:

1. A method for forming a high-voltage non-junction field effect device, the method comprising the steps of:
    providing a substrate;
    forming a fin-shaped structure on the substrate;
    sequentially forming on a surface of the fin-shaped structure of a channel layer, a barrier layer, a gate dielectric layer and a metal layer, wherein an energy band gap energy of the barrier layer is greater than a width of the channel layer;
    etching the metal layer and the gate dielectric layer to form a gate structure;
    forming spacers on both sides of the gate structure;
    forming source and drain on side walls on both sides of the barrier layer.

2. The method of claim 1, wherein the substrate is a silicon-on-insulator substrate.

3. The method of claim 1, wherein the channel layer is made of MoS2, WS2, MoSe2, WSe2, WTe2 in or one kind of MoTe2.

4. The method of claim 3, wherein a thickness range of the channel layer is 0.5 nm~10 nm.

5. The method of claim 1, wherein the barrier layer is made of MoS2, WS2, MoSe2, WSe2, WTe2 or one kind of MoTe2.

6. The method of claim 5, wherein a thickness of the barrier layer is in a range of 0.1 nm-5 nm.

7. The method of claim 3, wherein the channel layer and the barrier layer are made by the forming processes of CVD, PVD, ALD, ALE, MBE, MOCVD, UHCVD, RTCVD or MEE.

8. The method of claim 1, wherein the gate dielectric layer is made of silica, alumina, zirconia or hafnia.

9. The method of claim 8, wherein the gate dielectric layer using the forming processes of MOCVD, CVD, ALD or MBE.

10. The method of claim 1, wherein the metal layer is made of Cr or Au.

11. The method of claim 10, wherein the metal layer comprising a thickness in a range of 100 nm-300 nm.

12. The method of claim 10, wherein the metal layer using a forming process of PVD, MOCVD or ALD.

13. The method of claim 1, wherein the step of etching the metal layer and the gate dielectric layer comprises:
    coating a photoresist on the metal layer, and then patterning the photoresist and using the patterned photoresist as a mask;
    dry etching the metal layer and the gate dielectric layer using the patterned photoresist as the mask to form the gate structure comprising the metal layer and the gate dielectric layer.

14. The method of claim 1, wherein the spacer is made of silicon nitride.

15. The method of claim 1, wherein the source and drain electrodes made of Au.

* * * * *